United States Patent
Jimarez et al.

(10) Patent No.: US 6,407,334 B1
(45) Date of Patent: Jun. 18, 2002

(54) I/C CHIP ASSEMBLY

(75) Inventors: Lisa J. Jimarez; Miguel A. Jimarez, both of Newark Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/727,271

(22) Filed: Nov. 30, 2000

(51) Int. Cl.$^7$ ................................................ H01L 23/02
(52) U.S. Cl. ...................... 174/52.4; 257/724; 257/725; 257/713; 257/738; 257/778; 361/718; 361/719
(58) Field of Search ................................ 174/52.4, 52.2; 257/706, 707, 704, 724, 725, 712, 713, 737, 738, 778; 361/718, 719

(56) References Cited

U.S. PATENT DOCUMENTS

| | | | |
|---|---|---|---|
| 5,371,404 A | 12/1994 | Juskey et al. | 257/659 |
| 5,796,170 A | 8/1998 | Marcantonio | 257/786 |
| 5,844,168 A * | 12/1998 | Schueller et al. | 174/52.4 |
| 5,866,943 A | 2/1999 | Mertol | 257/712 |
| 5,895,967 A | 4/1999 | Stearns et al. | 257/691 |
| 5,955,789 A | 9/1999 | Vendramin | 257/786 |
| 6,011,304 A * | 1/2000 | Mertol | 257/706 |
| 6,046,077 A * | 4/2000 | Baba | 438/127 |
| 6,084,777 A * | 7/2000 | Kalidas et al. | 361/707 |
| 6,198,635 B1 * | 3/2001 | Shenoy et al. | 361/760 |
| 6,232,652 B1 * | 5/2001 | Matsushima | 257/667 |

* cited by examiner

Primary Examiner—Dean A. Reichard
Assistant Examiner—Hung V Ngo
(74) Attorney, Agent, or Firm—William N. Hogg

(57) ABSTRACT

A chip mounting assembly includes a dielectric substrate having at least one integrated circuit (I/C) chip mounted thereon. An electrically conductive cover plate is in contact with all the chips with an electrically non-conducting thermally conducting adhesive. A stiffener member is provided which is mounted on the substrate and laterally spaced from the integrated circuit chip. At least one electrically conductive ground pad is formed on the substrate. The stiffener has at least one through opening therein and electrically conductive adhesive extending through each opening and contacting the cover plate and each ground pad.

13 Claims, 4 Drawing Sheets

I/C CHIP ASSEMBLY

1. Field of the Invention

This invention relates generally to I/C chip mounting structures which include a substrate and an electrically and thermally conducting cover plate and a method of manufacturing the same. In even more particular aspects, this invention relates to an I/C chip assembly which electrically insulates the chip from the cover plate but provides grounding of the substrate to the cover plate.

2. Background Information

In the packaging of I/C chips, there has developed a need for a chip package that includes a cover plate for the assembly, which cover plate is thermally conducting for heat transfer, and also electrically conducting for grounding the substrate, while preventing the chip itself from being electrically grounded to the cover plate, so that the cover plate can act as both a heat sink for the chip and also an electrical ground for the substrate.

SUMMARY OF THE INVENTION

According to the present invention, a chip mounting assembly is provided which includes a dielectric substrate having at least one integrated circuit (I/C) chip mounted thereon. An electrically conductive cover plate is in contact with said at least one chip by an electrically non-conducting thermally conducting material. A stiffener member is provided which is mounted on the substrate and laterally spaced from the integrated circuit chip. At least one electrically conductive ground pad is formed on the substrate. The stiffener has at least one through opening therein and electrically conductive material extending through said at least one opening and contacting said cover plate and said at least one ground pad. The invention also provides a method of forming such an I/C chip assembly.

DESCRIPTION OF THE INVENTION

DESCRIPTION OF THE PREFERRED EMBODIMENT

The present invention provides an I/C chip assembly which includes a substrate mounting one or more I/C circuit chips and, optionally, other devices, wherein the chip assembly includes a cover plate which acts as a heat sink by being connected by an electrically non-conductive, thermally conductive adhesive to the chip, and which cover plate also is connected by an electrically conductive adhesive to ground pads on the substrate to provide a ground for the substrate.

Figure 1:
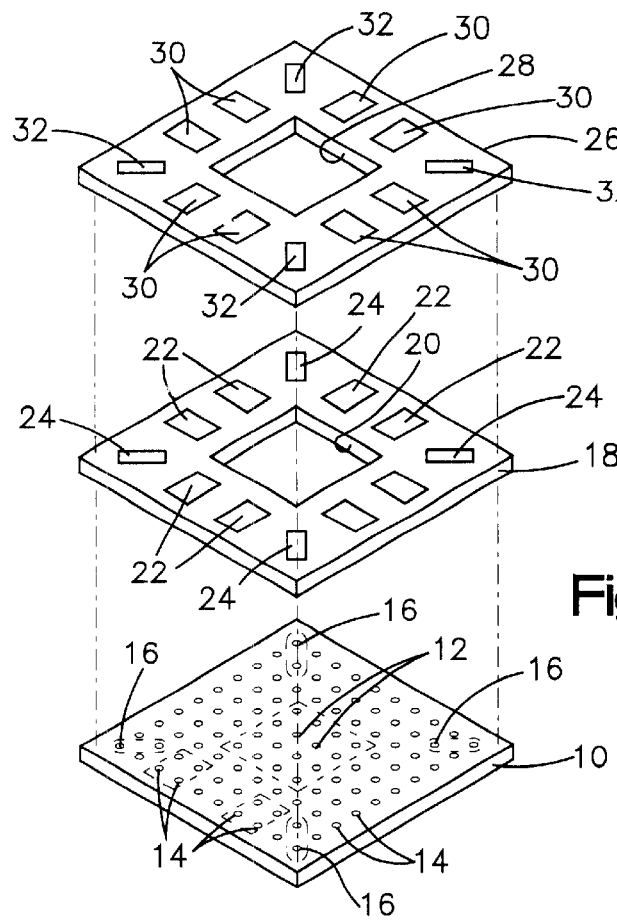
FIG. 1 is an exploded view of a substrate, a stiffener and a thermal adhesive in position for lamination as a first step in the process of forming the device of the present invention.

As seen in FIG. 1, a generally conventional dielectric substrate 10 is provided which has a series of mounting pads formed thereon (other circuitry and features have been omitted for clarity). The mounting pads include a group of mounting pads 12 which are for mounting an I/C chip; a group of mounting pads 14 for mounting capacitors, and a group of mounting pads 16 for providing electrical connections for grounding purposes to a cover plate. The substrate 10 can be made of any conventional dielectric material, such as FR4, polyimide, polytetrafluoroethylene or other dielectric materials, A dry film of adhesive material 18 is provided. The film of material 18 has a central opening 20, a plurality of side openings 22 and a plurality of corner openings 24 formed therein. The opening 20 corresponds to and is in alignment with the set of mounting pads 12; the openings 22 correspond to and are in alignment with the mounting pads 14, and the openings 24 correspond to and are in alignment with the ground pads 16. Preferably, the film of material 18 is a dry film adhesive, such as a polyimide/acrylic adhesive of the type sold under the trademark Pyralux by duPont. However, any film adhesive which can have openings formed therein can be used.

A stiffener member 26 is provided which preferably is formed of stainless steel, preferably 400 Series, and, more particularly, 420. The stiffener 26 has a central opening 28 which corresponds to and aligns with the opening 20 in the film material 18, side openings 30 which correspond to and align with the openings 22 in the film 18 and corner openings 32 which correspond to and align with openings 24 in the film 18.

Figure 2:
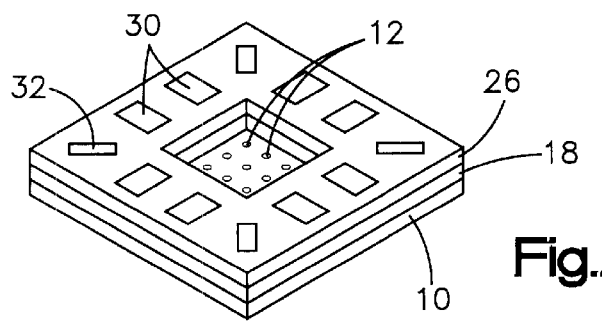
FIG. 2 is a perspective view showing the substrate stiffener and a film of adhesive material laminated together to form the basis for forming the present invention.
Figure 3:
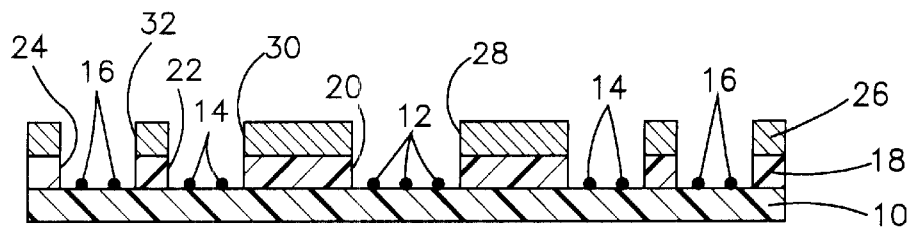
FIGS. 3–10 are longitudinal, sectional views, somewhat diagrammatic, showing the steps in forming an I/C chip assembly according to this invention.
Figure 10:
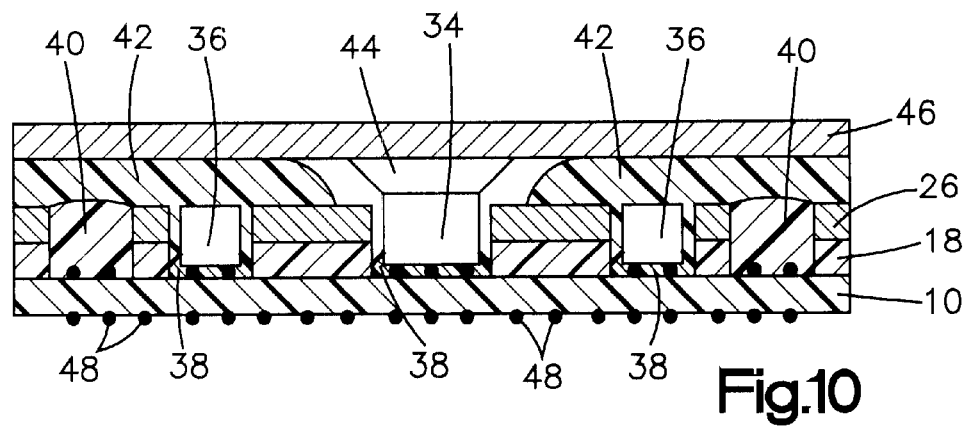

The substrate 10, film 18 and stiffener 26 are laid up in a lamination press and heated to about 150° C. at 300 psi gauge for about an hour and a half to form a laminate of these three items, as shown in FIGS. 2 and 3. (The preferred sequence for forming the chip assembly is shown in FIG. 10).

Alternatively, instead of a separate dry film, adhesive 18 can be replaced with a liquid adhesive which can be applied to the stiffener 26, and this will be used as the adhesive to secure this stiffener to the substrate. The liquid adhesive can be any one of several adhesives; a particularly useful adhesive is GE 3281 manufactured by General Electric Corporation.

Figure 4:
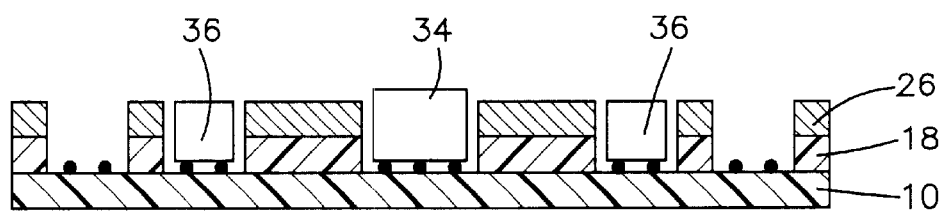
Figure 5:
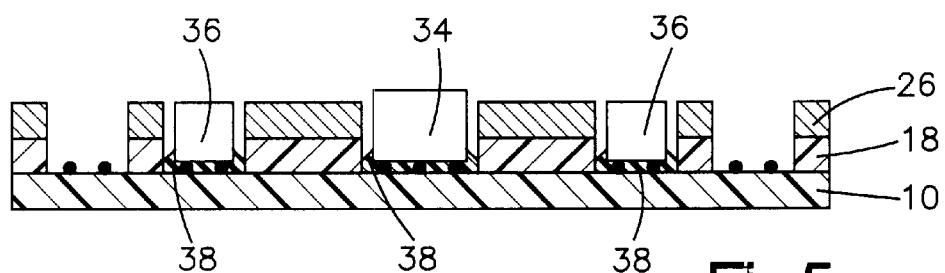

Following the lamination process, an I/C chip 34 is mounted on the pads 12, and capacitors 36 are mounted on the pads 14 by conventional solder reflow techniques, as shown in FIG. 4. Following the attachment of the I/C chip 34 and capacitors 36, conventional underfill material 38 is applied around the solder connections of the chip 34 to the substrate and the capacitors 36 to the substrate, as shown in FIG. 5. Conventional underfill material preferably is an epoxy with silica filler, such as Namics 8437-2 sold by the Namics Corporation, although other materials can be used. The Namics 8437-2 underfill 38 is cured at about 150° for about one hour at atmospheric pressure.

Figure 6:
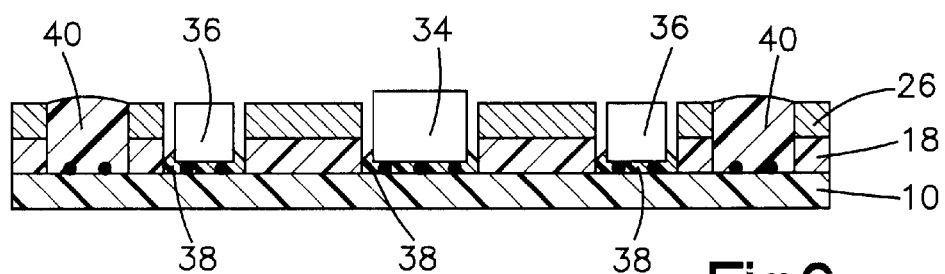

Following the application of the underfill 38, a conductive material such as a conductive adhesive 40 is applied over each set of the ground pads 16 and in the openings 24 and 32 of the dielectric film 18 and stiffener 26, respectively, as shown in FIG. 6. Any type of conductive adhesive can be used. A preferred adhesive is Able Stik 965-1L, which is an epoxy with silver flakes therein, sold by Able Stik Chemical Corporation. Other conductive materials such as conductive inks may be used.

Figure 7:
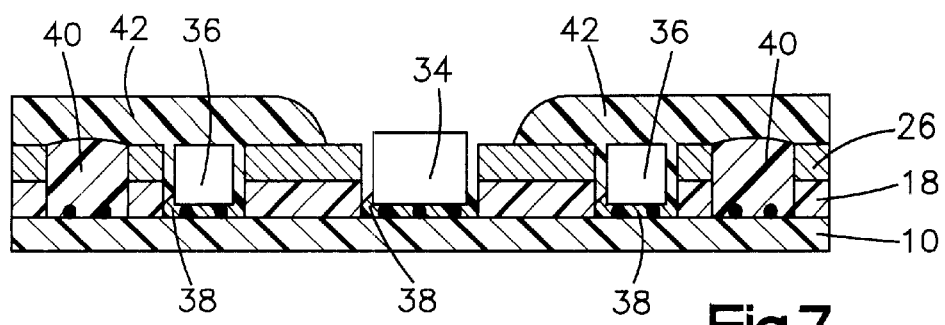

Following the deposition of the conductive epoxy 40 on the ground pads 16, a generally circumferential layer of electrically conductive material 42, preferably the same material as the material 40, is provided which is disposed over both the material 40 and the capacitors 36 and in the openings 22 and 30 in the adhesive film 18 and the stiffener 26, respectively. Care must be taken that this conductive material 42 does not extend over and into contact with the I/C chip 34 since the conductive material 42 eventually will serve to provide the electrical connection between the ground pads 16 and the cover plate, which will be described presently, and which would short out the chip 34 and cause the assembly to be inoperable. This step in the process is shown in FIG. 7.

Figure 8:
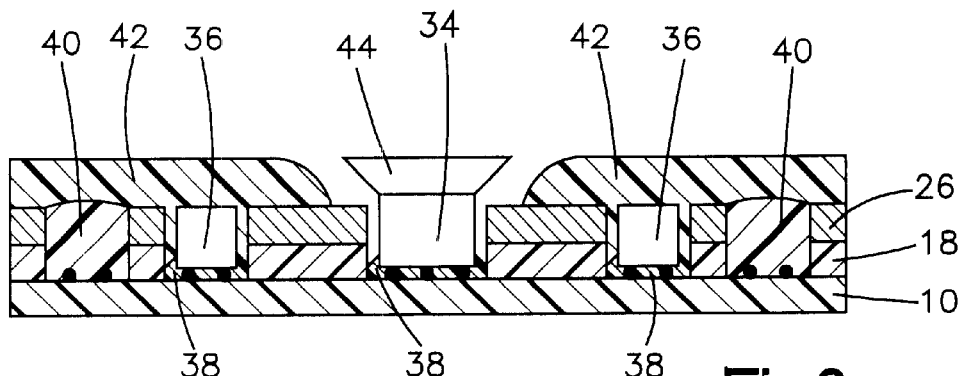

Following the deposition of the conductive material 42, a non-electrically conductive, thermally conductive material, preferably an adhesive 44 is applied over the I/C chip 34 and in the openings 20 and 28 in the adhesive film 18 and 26, respectively. The adhesive material 44 is preferably a silicone material having a filler therein. A particularly useful material is sold by General Electric Corporation under the trademark GE 3281. However, other thermally conductive, non-electrically conducting materials can be used. This step is shown in FIG. 8.

Figure 9:
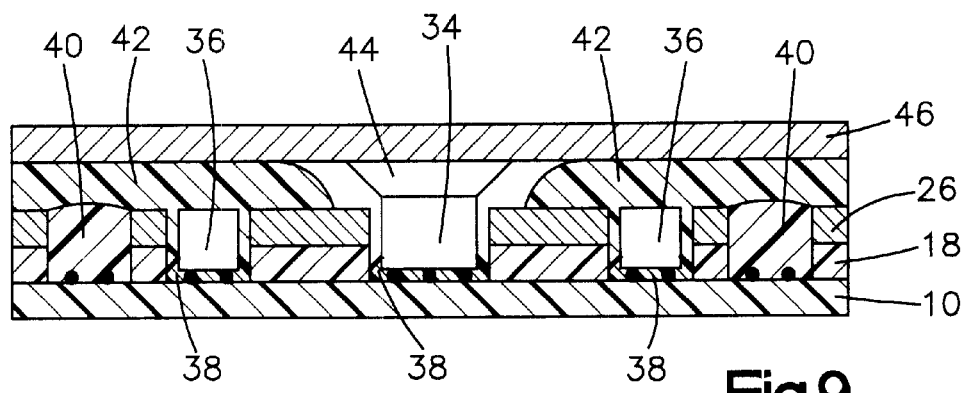

A cover plate 46 is placed overlying the adhesives 42 and 44. The cover plate 46 functions both as a grounding device and as a heat sink and, thus, a good electrically and thermally conducting material is preferred for the cover plate 46. A particularly useful material is copper, although other metal plates could be used. As can be seen in FIG. 9, the cover plate 46 is electrically connected through adhesives 42 and 40 to the ground pads 16 on the substrate 10, and the I/C chip 34 is connected through electrically non-conducting, thermally conductive adhesive 44 to the cover plate 46. Thus, the cover plate 46 operates both as a heat sink with respect to the I/C chip 34 and a ground connection with respect to the substrate 10. The assembly is cured for approximately one hour at about 150° C. at atmospheric pressure to provide the final heat chip assembly.

A plurality of ball grid array solder ball connectors 48 are applied to the bottom surface 50 of the substrate 10, as shown in FIG. 10. These provide the necessary connections to attach the I/C chip assembly to a printed wiring board.

Figure 11:
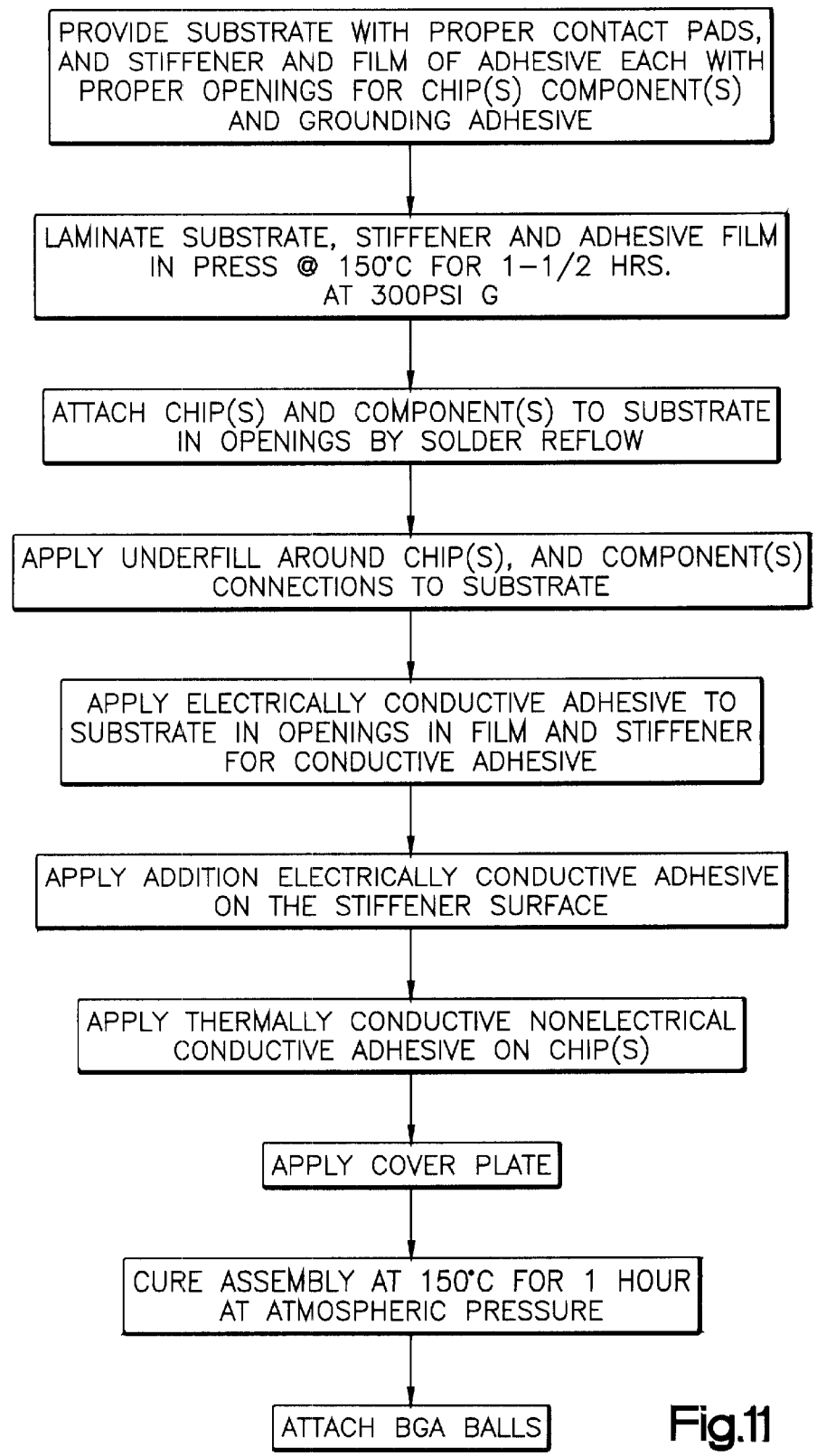
FIG. 11 is a flow chart of the steps involved in preparing the chip assembly.

The various steps of forming the I/C chip assembly are shown in FIG. 11.

While the invention has been described using but a single I/C chip and various capacitors, it is to be understood that several I/C chips could be mounted on the substrate as well as other devices besides or in addition to capacitors. The important thing is that the conductive adhesive not come in contact with any of the I/C chips or any other device which could be unintentionally electrically grounded. Therefore, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A chip carrier and chip assembly comprising:
   a dielectric substrate having at least one I/C chip mounted thereon;
   an electrically and thermally conductive cover plate connected to said at least one chip with an electrically non-conductive, thermally conductive material;
   a stiffener member mounted on said substrate and having a chip receiving through opening therein which at least partially surrounds said I/C chip;
   at least one electrically conductive ground pad mounted on said substrate;
   said stiffener member having at least one through conductive material receiving opening therein; and
   electrically conductive material disposed in said at least one conductive material receiving opening and electrically connecting said cover plate and said at least one ground pad.

2. The assembly of claim 1 wherein said stiffener member is bonded to said substrate with a dry film adhesive.

3. The assembly of claim 1 wherein there are a plurality of conductive material receiving openings with conductive material therein.

4. The assembly of claim 1 wherein there is at least one additional component mounted on said substrate and said stiffener member has a component receiving opening for each additional component.

5. The assembly of claim 4 wherein said electrically conductive material overlies at least a portion of said at least one additional component.

6. The assembly of claim 1 wherein said stiffener member is bonded to said substrate by a liquid adhesive.

7. The assembly of claim 1 wherein the substrate has a plurality of mounting pads for mounting said I/C chip and to form said at least one ground pad.

8. The assembly of claim 1 wherein said cover plate is formed of a metal.

9. The assembly of claim 1 wherein said substrate includes a plurality of mounting members on the opposite face thereof from said I/C chip mounting for joining the assembly to a printed wiring board.

10. The assembly of claim 9 wherein said mounting members includes ball grid array solder balls.

11. The assembly of claim 1 wherein said electrically conductive material is an electrically conductive adhesive.

12. The assembly of claim 11 wherein said electrically conductive adhesive is a polymer with metal flakes therein.

13. The assembly as defined in claim 1 wherein said thermally conductive electrically non-conductive material is an adhesive.

* * * * *